(12) United States Patent
Jin et al.

(10) Patent No.: US 9,633,154 B2
(45) Date of Patent: Apr. 25, 2017

(54) SEQUENTIAL STRUCTURE EXTRACTION BY FUNCTIONAL SPECIFICATION

(71) Applicant: Synopsys, Inc., Mountain View, CA (US)

(72) Inventors: Naiyong Jin, Shanghai (CN); Hong Liang, Beijing (CN)

(73) Assignee: Synopsys, Inc., Mountain View, CA (US)

(*) Notice: Subject to any disclaimer, the term of this patent is extended or adjusted under 35 U.S.C. 154(b) by 46 days.

(21) Appl. No.: 14/648,693

(22) PCT Filed: Nov. 30, 2012

(86) PCT No.: PCT/CN2012/085638
§ 371 (c)(1),
(2) Date: May 29, 2015

(87) PCT Pub. No.: WO2014/082289
PCT Pub. Date: Jun. 5, 2014

(65) Prior Publication Data
US 2015/0317422 A1    Nov. 5, 2015

(51) Int. Cl.
*G06F 17/50* (2006.01)

(52) U.S. Cl.
CPC ................ *G06F 17/5045* (2013.01)

(58) Field of Classification Search
CPC .................................................. G06F 17/5045
USPC ........................................ 716/101, 106, 107
See application file for complete search history.

(56) References Cited

U.S. PATENT DOCUMENTS 6,044,211 A * 3/2000 Jain ........................ G06F 8/34
    716/102
6,587,997 B1    7/2003 Chen et al.

FOREIGN PATENT DOCUMENTS

CN    1365048    8/2002
CN    101344899    1/2009

OTHER PUBLICATIONS

Written Opinion of the International Search Authority in PCT/CN2012/085638, Sep. 12, 2013 (6 pages).
International Search Report in PCT/CN2012/085638, Sep. 12, 2013 (6 pages).
Synopsys: LEDA Clock Domain Crossing Rules Guide, 2008.
Naiyong Jin, Hong Liang: Structure Extraction by Functional Specification, submitted to the 18th International Conference on Tools and Algorithms for the Construction and Analysis of Systems (TACAS 2012).

(Continued)

*Primary Examiner* — Sun Lin
(74) *Attorney, Agent, or Firm* — HIPLegal LLP; Judith Szepesi

(57) ABSTRACT

A method and apparatus for structure analysis of a circuit design are described. In one exemplary embodiment, a functional specification of a circuit design is received, where the functional specification is defined based on a behavior layer abstraction. In addition, design codes for the circuit design are received, wherein in each design code of the design codes is defined based on the behavior layer abstraction. Furthermore, the design codes are searched, which is performed in the behavior layer abstraction, for one or more of the design codes that satisfy the functional specification. Each of the design codes that satisfy the functional specification is therefore recognized.

20 Claims, 10 Drawing Sheets

(56) References Cited

OTHER PUBLICATIONS

Emmanuel Filiot, Naiyong Jin, Jean-Francois Raskin: Compositional Algorithms for LTL Synthesis, In Proceedings of the International Symposium on Automated Technology for Verification and Analysis (ATVA), 2010, pp. 112-127.
Joseph Buck, Dong Wang, Yunshan Zhu: Formal model construction using HDL simulation semantics, In Proceedings of the IEEE International High Level Design Validation and Test Workshop, 2007, pp. 115-122.
Clifford E. Cummings, Clock Domain Crossing (CDC) Design & Verification Techniques Using SystemVerilog, SNUG-2008, Boston (2008).

* cited by examiner

Algorithm : Binding Search

Input: $D = \{M_1, M_2, \ldots\}$
    Input: $S = \{I, O, F\}$
    Input: $\mathbf{MP}_S$ 1.  $O_D := \bigcup_{M_j \in D} O_j$;
2.  $I_D := (\bigcup_{M_j \in D} I_j) \setminus O_D$;
3.  foreach $b_O \in AllBinding(O_D, O)$ do
4.     $DepOut := CalculateAllDependentOutput(b_O)$;
5.     $DepMac = \{M_j \in D \mid O_j \cap DepOut \neq \emptyset\}$;
6.     $DepIn = \bigcup_{M_j \in DepMac} I_j \cap I_D$
7.     foreach $b_I \in AllBinding(DepIn, I)$ do
8.         $is\_a\_refinement(b_O, b_I, DepMac, \mathbf{MP}_S)$;

FIG. 4

Algorithm : is_a_refinement($b_O, b_I, M_1, M_2$)

Input: $M_1$ : a deterministic Mealy machine
Input: $M_2$ : a non − deterministic Mealy machine 1  if ($I_1 \nsubseteq I_2 \vee O_2 \nsubseteq O_1$) then
2     return false ;
3  $M := \langle Q, I_2, O_2, q_{ini}, T \rangle := M_1 \times M_2$
4  Frontier := Visited := $\{q_{ini}\}$;
5  while (Frontier ≠ ∅) do
6     New_Frontier := ∅;
7     foreach ($q \in$ Frontier) do
8         foreach ($in \in \Sigma_{I_2}$) do
            ForwardExp :=   BindExp($b_O$) ∧ BindExp($b_I$) ∧ in
                          ∧ ActiveExp($q_1$) ∧ ActiveExp($q_2$)
9                               ∧ DeltaExp($q_1$) ∧ DeltaExp($q_2$)
10         if ForwardExp is Un-Satisfiable then
11             return false ;
12         Next := $\{\langle q_m, q_n \rangle \mid v \models ForwardExp \wedge v(q'_m) = v(q'_n) =$ true $\}$;
13         foreach ($q \in$ Next) do
14             if $q \notin$ Visited then
15                 Visited.add($q$);
16                 New_Frontier.add($q$);

17     Frontier = New_Frontier;
18 return true ;

FIG. 5

$$BindExp(b) = \bigwedge_{b(u)=v} u \rightarrow v \wedge v \rightarrow u$$
$$ActiveExp(q_1) = q_1 \bigwedge_{q \in Q, q \neq q_1} \neg q$$
$$TransExp(q, in) = (q \wedge in) \rightarrow (\bigvee_{\langle o, q_k \rangle \in T(q, in)} o \wedge q'_k)$$
$$DeltaExp(q) = \bigwedge_{in \in \Sigma_I} TransExp(q, \sigma_I)$$

SEQUENTIAL STRUCTURE EXTRACTION BY FUNCTIONAL SPECIFICATION

FIELD

The disclosed embodiments relate to circuit design, and more particularly to the structure analysis of a circuit design.

BACKGROUND

Traditional circuit static analysis works on netlists generated by logic synthesis. This circuit analysis attempts to identify structure patterns by traversing the netlists generated by logic synthesis. A netlist describes the connectivity of an electronic design. Netlists usually convey connectivity information and can provide instances, nets, and perhaps some attributes. Netlists have an abstraction layer that is structural, because netlists describe connectivity of an electronic design. The major ingredients of the netlists are logic elements, such as the flip-flops and the combinatorial gates, and their connectivity.

Current circuit structure analysis tools work on netlists synthesized from codes in hardware description language. The structure pattern matching procedures are implemented manually. One has to develop matching algorithms for each structure pattern. This approach is not flexible. Given the design variants and the differences in synthesizers, it is easy to miss or falsely recognize some structure patterns.

SUMMARY

A method and apparatus for structure analysis of a circuit design is described. In one exemplary embodiment, a functional specification of a circuit design is received, where the functional specification is based on a behavior layer abstraction. In addition, design codes for the circuit design are received, where the each of the design codes is based on a behavior layer abstraction. Furthermore, the design codes are searched for one or more design codes that satisfy the functional specification. This search is performed in the behavior layer abstraction, in one embodiment. Each of the design codes that satisfy the functional specification is stored, in one embodiment.

BRIEF DESCRIPTION OF THE DRAWINGS

The disclosed embodiments are illustrated by way of example and not limitation in the figures of the accompanying drawings in which like references indicate similar elements.

FIG. 4 illustrates an exemplary pseudo code for signal binding search, according to one embodiment.

FIG. 5 illustrates an exemplary pseudo code for a Mealy machine refinement check, according to one embodiment.

DETAILED DESCRIPTION

Embodiments of the present invention disclose improved methods and apparatuses for performing structure analysis of a circuit design by performing a sequential structure extraction by functional specification. In one embodiment, the structure analysis is performed by receiving a function specification of the circuit design as well as a number of design codes for that circuit design. The functional specification is checked to see if this specification is realizable. If the functional specification is realizable, a Mealy machine for the functional specification is created. In addition, corresponding Mealy machines are created for each of the design codes. The Mealy machines for the functional specification and the design codes are based on the behavior layer abstraction, which describes the behavior of the circuit. With the Mealy machine for the functional specification and the design codes, a search is performed to determine which Mealy machines of the design codes refine the Mealy machine of the functional specification. The design codes that refine the functional specification are identified. In one embodiment, these design codes are stored for later use. While in one embodiment, a Mealy machine is created for the functional specification and each of the design codes, in alternate embodiments, different types of state machines may be used for the functional specification and/or the design codes (Moore machines, etc.).

A circuit structure analysis tool can work on netlists synthesized from codes in a hardware description language. Given the design variants and the differences in synthesizers, this tool can miss or falsely recognize some structure patterns.

Figure 1:
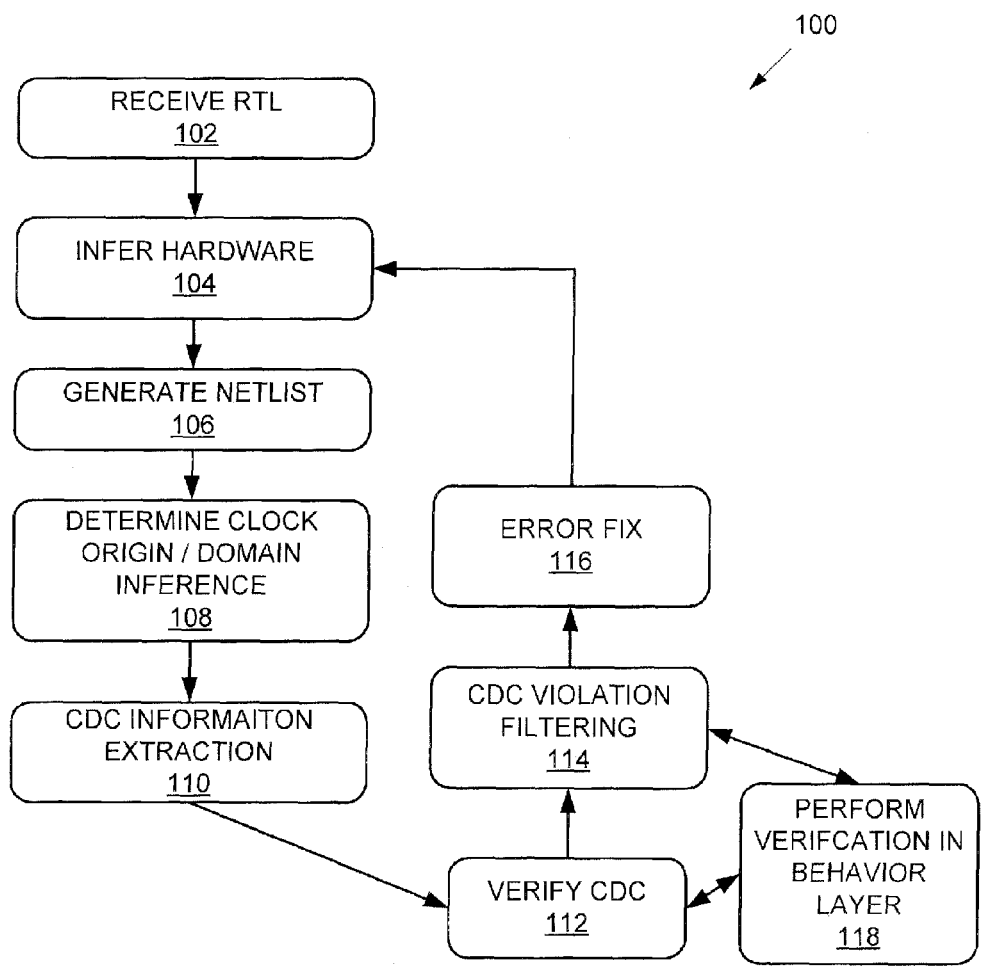
FIG. 1 illustrates a process flow diagram for a prior art method of performing a workflow of a clock-domain-crossing synchronizer detection.

FIG. 1 illustrates a process flow diagram of a process 100 for performing a workflow of a clock-domain-crossing synchronizer detection. In FIG. 1, process 100 begins by receiving a register transfer level (RTL) design abstraction at block 102. In one embodiment, the RTL is a design abstraction which models a synchronous digital circuit in terms of the flow of digital signals (data) between hardware registers, and the logical operations performed on those signals. In this embodiment, the RTL abstraction is used in hardware description languages (HDLs) to create high-level representations of a circuit, from which lower-level representations and ultimately actual wiring can be derived.

At block 104, process 100 infers the hardware. For example and in one embodiment, process 100 runs a hardware inference on the RTL design codes following the industry standards, such as IEEE 1364.1-2002, 1076.6-1999, etc.

At block 106, process 100 generates the netlists. In one embodiment, process 100 generates the netlists for the RTL design abstracts. In one embodiment, netlists have an abstraction layer that is structural, because netlists describe connectivity of an electronic design. Process 100 determines the clock origin or domain inference at block 108. In one embodiment, a clock domain is a part of a design that has a clock that operates asynchronous to, or has a variable phase relationship with, another clock in the design. At block 110, process 100 extracts the clock domain crossing (CDC) information. In one embodiment, process 100 extracts the CDC information by identifying clock domain crossing paths and linking related paths into groups (e.g., data path and control paths of a mux-synchronizer).

Process 100 verifies the CDC at block 112. In one embodiment, process 100 verifies the CDC using verification in the behavior layer at block 118. In one embodiment, this verification uses the design, generated assertions, and user specified input/output environmental constraints. Process 100, at block 114, filters the results of the verification at blocks 112 and 118 for CDC violations.

In one embodiment, process 100 analyzes a results database to filter out false CDC structural violations. False CDC structural violations are those CDC violations that are identified by the verification, but that do not violate the actual constraints of the circuit. In one embodiment, the results database includes user-generated templates that are used to filter out false CDC structural violations. At block 116, process 100 performs an error fix, to remove the false CDC structural violations from the filter. In one embodiment, an uncovered pattern may cause a false violation, and this can lead to lost time for debugging of the pattern and updating of the results database.

The workflow illustrated in FIG. 1 has several shortcomings. In particular, the structure patterns of CDC synchronizers are hand-coded. This can mean that pattern matching procedures must be implemented for various kinds of structure patterns. In addition, an uncovered pattern may cause missing or false violations that take time to correct, by debugging the static verification tools and making patches. In addition, this determination is not self-contained. Without the behavior layer verification at block 118, the static structure analysis tool gives a partial analysis. The use of the static structure analysis tool may require extra skills and processes for a user to have a complete static structure check.

Furthermore, the static structure analysis tool and behavior results verifier works on different abstract layers. The results verifier works on the behavior layer, but the traditional static structure analysis tool works on the netlist layer. On the one hand, the behavior layer describes the behavior of the electronic design. On the other hand, the netlist layer is a structural abstraction layer because netlists describe a circuit using the connectivity of an electronic design. In one embodiment, this can make it difficult to construct a finite state machine from the netlists for behavior verification. In addition, violation filtering occurs after violation detection. It would be better if the structure analysis can pass the acceptable structures during the violation detection stage, instead of detecting false negatives after the violation detection stage.

As described above, the current workflow for a static structure analysis tool has several shortcomings. The Sequential structure Extraction by Functional Specification (SEFS) aims at a search engine that determines which signals form design codes such that the driving machines of selected signals can enforce the satisfiability of a realizable specification. In one embodiment, the selected output signals are outputs of sequential logics. SEFS amounts to locating the driving machines of the selected outputs. As described above, the current circuit structure analysis tools work on netlists synthesized from codes in hardware description language. Given the design variants and the differences of synthesizers, the tool can miss or falsely recognize some structure patterns. SEFS brings flexibility to structure analysis by allowing more design freedom. SEFS ignores certain structural variants and still is confident in labeling machines with a design pattern, provided the behavior of the design pattern can enforce the specified functionality. Thus, SEFS promotes the abstraction layer of circuit structure analysis from netlists to behavior layer. In addition, if the user composes a specification of unwanted behaviors, SEFS can automatically locate the corresponding codes in this design. In one embodiment, SEFS can be used for reactive control circuits, such as reactive control circuits that implement a communication protocol. For example and in one embodiment, a CDC synchronizer is a reactive control circuit that implements a communication protocol.

In one embodiment, a SEFS process is as follows. SEFS checks the realizability of a controller specification. A controller specification is unrealizable if the working environment has a strategy to falsify the proposed behavior of the controller. If the controller has a functional specification that is unrealizable, SEFS does not continue further. For a realizable functional specification, there could be winning strategies with which the controller can enforce the satisfiability of the specification. The SEFS generates a Mealy machine, named as Master Plan, which encodes all the winning strategies of the controller. SEFS enumerates the machines in the design codes and checks whether the selected machines refine Master Plan by giving a stronger output letter on common input letters. In one embodiment, a letter refers to a value combination of variables under study. An input letter is a value of input variables. For instance, suppose the inputs are {a, b, c} and all of them range over {0, 1}, then <0, 1, 0> is an input letter denoting a=0, b=1, and c=0. One or more of the design codes that refine the Master Plan are labeled as instances of the specification. SEFS, in one embodiment, carries out the refinement reasoning on the products from the design machines and the Master Plan. While in one embodiment, a Mealy machine is created for the functional specification, in alternate embodiments, different types of state machines may be used for the functional specification (Moore machines, etc.).

Figure 2:
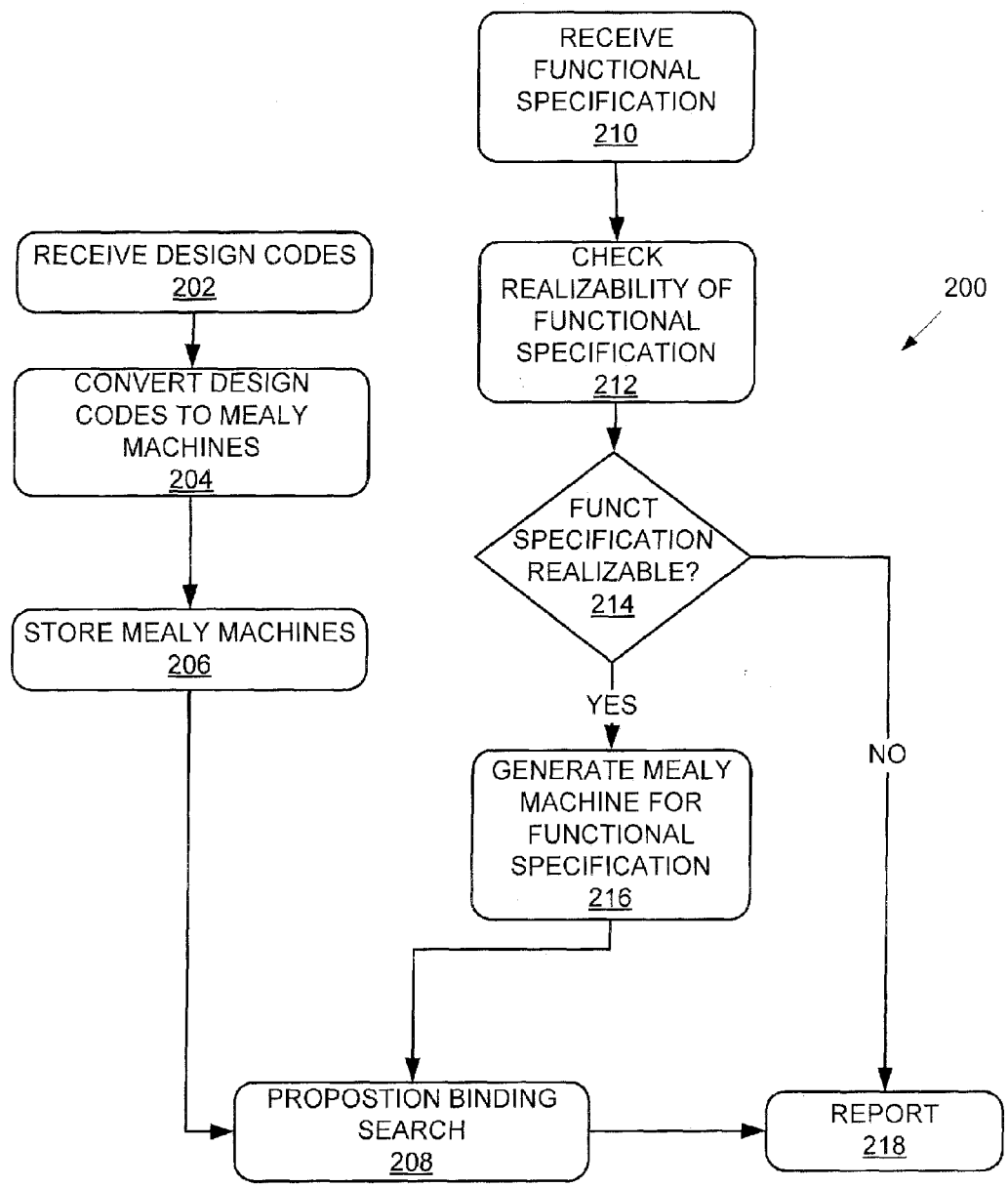
FIG. 2 illustrates a process flow diagram for performing a sequential structure extraction by functional specification, according to one embodiment.

FIG. 2 illustrates a process flow diagram of a process 200 for performing a sequential structure extraction by functional specification, according to one embodiment. In FIG. 2, process 200 begins by receiving a functional specification at block 210. In one embodiment, the functional specification describes the functions that are desired for the designed circuit. In this embodiment, the functional specification can include an interface for input and output, assumptive properties over the input ports, and guaranteed properties over the output ports. For example and in one embodiment, a functional specification of a controller describes the interface signals and the behavior properties. The behavior properties include the assumptions regarding the working environment of the controller and the guarantees, which guarantee how the controller will behave.

Listing 1 illustrates an exemplary functional specification of a synchronizer,
    module sync_spec (input clk, input req, output grant);
    // always eventually there will be a request
    A 1: assume property (@(posedge clk) always (!req|=>s_eventually req));

```
// req should hold on if there is no grant
    A 2: assume property (@(posedge clk) always (req &&
!grant)|=>req));
    // req should be de-asserted one cycle after the assertion
of grant
    A 3: assume property (@(posedge clk) always ((req &&
grant)|=>!req));
    // grant should follow the rise of req
    G 1: assert property (@(posedge clk) always ((!req ##1
req)|=>grant));
    // the duration of holding grant is between 1 to 5 cycles
    G 2: assert property (@(posedge clk) always (grant[*1:
5]|=>!grant);
    // no new assertion of grant until a new req
    G 3:
        assert property (@(posedge clk) always (grant ##1 !grant)
|=>(!grant s_until req));
```

Listing 1. Example of a Functional Specification for a Controller

In Listing 1, the synchronizer has an input signal req and an output grant. It is also driven by a synchronous clock clk. The environment controls the input signals. The synchronizer updates the output signals. The assumptions A1, A2, and A3 specify the assumed properties over req, and the guarantees G1, G2, and G3 specify the behaviors of grant. In one embodiment, the sync_spec can be interpreted as the Equation (1)

$$(A1\char`\^A2\char`\^A3)=>(G1\char`\^G2\char`\^G3) \quad (1)$$

In this embodiment, the signals reg, grant, and clk are not bound with any actual signals in a design. Furthermore, in on embodiment, the sync_spec is a template. SEFS fills the template with a binding between the design signals and specification signals such that the behavior of the selected outputs can enforce the satisfiability of Equation (1). If there does exist such a signal binding, SEFS returns with an instance as illustrated in Equation (2),

```
sync_spec_instance_1 (.clk(test.LCLK), .req(tes-
    t.req_0), .grant(test.grant_0))                (2)
```

In one embodiment, Equation (2) illustrates that once hclk, req, and grant are bound with actual signals LCLK, req_0, and grant_0 from design module test, then the selected signals LCLK, req_0, and grant_0 make up an instance of sync_spec.

At block 212, process 200 checks the realizability of the functional specification. In one embodiment, a functional specification is realizable if there are winning strategies with which the controller can enforce the satisfiability of the specification. In contrast, a controller specification is unrealizable if the working environment has a strategy to falsify the proposed behavior of the controller. In this embodiment, process 200 does not have a way to figure out the controller for an unrealizable specification and process 200 does not need to look for machines for the specified functionality.

In one embodiment, the functional specification realizability check uses forward and backward algorithms to determine realizability. For example and in one embodiment, the backward algorithm is compact in representing the search space. In this example, the forward algorithm may not be that compact, but the forward algorithm is able to record the good actions against the input alphabets for the reachable states. In one embodiment, these algorithms assume that the controller plays first and the environment plays second. In this embodiment, a Mealy machine is synthesized from a realizable specification.

At block 214, process 200 determines if the functional specification is realizable from the results of block 212. If a specification fails the realizability check, process 200 reports the failure and exits at bock 218.

If the specification passes the realizability check, at block 216, process 200 generates a Mealy machine for the functional specification. In one embodiment, the Mealy machine for the functional specification is termed a Master Plan. This Master Plan is used for the proposition binding search of the Mealy machines generated at block 206. In one embodiment, the proposition binding search is a Mealy machine comparison algorithm. In this embodiment, the Master Plan is a Mealy machine generated for a realizable specification. In one embodiment, the Master Plan is complete in the sense that it captures all the strategies of a controller to enforce the satisfiability of a functional specification.

In addition, at block 202, process 200 begins by receiving design codes at block 202. In one embodiment, process 200 receives the design codes that are in the form of a hardware description language (HDL). In one embodiment, the design codes are in the form of an HDL, such as Verilog, VHDL, SystemVerilog, and/or other hardware description languages, whether known in the art or later developed. At block 204, process 200 converts the design codes to Mealy machines. In one embodiment, a Mealy machine is a finite-state machine whose output values are determined both by its current state and the current inputs. In one embodiment, process 200 stores the Mealy machines at block 206. While in one embodiment, a Mealy machine is created for each of the design codes, in alternate embodiments, different types of state machines may be used for the design codes (Moore machines, etc.).

At block 208, process 200 performs a proposition binding search using the Mealy machines of block 206 and the Master Plan from block 216. In one embodiment, the proposition binding search enumerates the output bindings. For each binding, process 200 verifies that the binding refines the Master Plan. In one embodiment, process 200 performs a Mealy machine refinement check after the calculation of the dependency context. The algorithm for Mealy machine refinement check determines if Mealy machine M1 refines Mealy machine M2 if each reachable state q of the product machine from M1 and M2 has an output letter for each input letter. Process 200 further reduces the check to the satisfiability check. In one embodiment, ForwardExp gives the next state of <q1, q2> under the input letter $\sigma_{I2}$. If the expression is unsatisfiable, in this embodiment, there is no output letter leading to a next state of <q1, q2> under $\sigma_{I2}$ That means the product machine <M1, M2> cannot move forward under $\sigma_{I2}$ starting from <q1, q2>. And M1 fails in refining M2. Embodiments of the proposition binding search are further described in FIG. 4-6 below.

Figure 3:
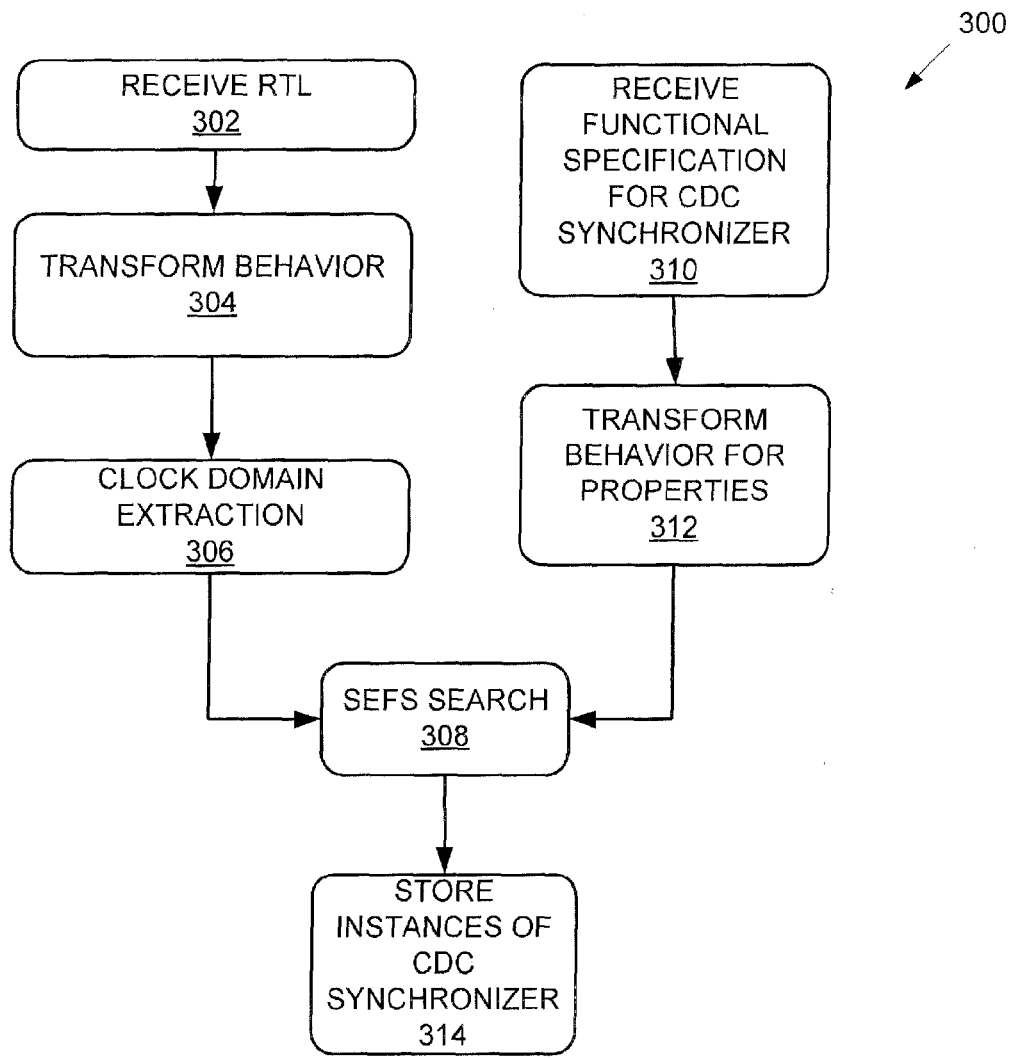
FIG. 3 illustrates a process flow diagram for performing a workflow of clock-domain-crossing synchronizer detection with a sequential structure extraction by functional specification, according to one embodiment.

As noted in connection with FIG. 1, the traditional static structure analysis workflow is a workflow that works on different abstract layers. In contrast, the sequential structure extraction by functional specification process of FIG. 2 is a process that works on entities in the behavior abstract layer. In one embodiment, the sequential structure extraction by functional specification can be applied to a workflow of clock-domain-crossing (CDC) synchronizer detection. FIG. 3 illustrates a process flow diagram of a process 300 for performing a workflow of detecting a CDC synchronizer with a sequential structure extraction by functional specification, according to one embodiment. In one embodiment, process 300 utilizes the sequential structure extraction by functional specification of process 200 to perform the workflow.

Process 300 begins by receiving the functional specification for the CDC synchronizer. In one embodiment, the functional specification describes the functions that are desired for the designed circuit. For example, a functional specification of a CDC synchronizer describes the interface signals and the behavior properties of the synchronizer. The behavior properties include the assumptions over the working environment of the CDC synchronizer and the guarantees, how the controller should behave. Process 300 transforms the behavior described by the functional specification for the properties at block 312 provided the specification is realizable. In one embodiment, the functional specification behavior transformation can be done using a functional specification behavior transformation tool or algorithm as known in the art.

In addition, in one embodiment, process 300 receives the RTL design abstraction for the circuit at block 302. At block 304, process 300 transforms the received RTL to the behavior layer. In one embodiment, the behavior layer describes the behavior of the elements in the circuit design. Process 300 performs the clock domain extraction at block 306. In one embodiment, process 300 performs the clock domain extraction by identifying clock domain crossing paths and linking related paths into groups (e.g., data path and control paths of a mux-synchronizer).

At block 308, process 300 performs the sequential structure extraction by functional specification using the clock domain extraction information of block 306 and the transformed functional specification from block 312. In one embodiment, process 300 performs a SEFS search as described in FIG. 2 above. For example and in one embodiment, process 300 performs an SEFS by checking the realizability of a CDC synchronizer specification. A CDC synchronizer specification is unrealizable if the working environment has a strategy to always falsify the proposed behavior of the controller. If the synchronizer has an unrealizable specification, SEFS does not continue further.

For a realizable functional specification, there could be winning strategies with which the synchronizer can enforce the satisfiability of the specification. The SEFS generates a Mealy machine, named as Master Plan, which encodes the winning strategies of the controller. As another example and in another embodiment, SEFS enumerates the machines in the design codes and checks whether the selected machines refine Master Plan by giving stronger output letter on common input letters. The design codes that refine the Master Plan are labeled as instances of the specification. SEFS carries out the refinement reasoning on the products from the design machines and the Master Plan.

At block 314, process 300 stores the instances of the CDC synchronizer. In one embodiment, the instances of the CDC synchronizer are the results of the SEFS search from block 312 above. For example and in one embodiment, the instances of the CDC synchronizer are design codes that refine the Master Plan of the functional specification.

The use of SEFS for structure analysis gives more flexibility and independence to structure analysis. For tool developers, it is not necessary to code the netlist structure patterns and pattern matching algorithms manually. A user of SEFS specifies the behavior properties, which is faster and easier than coding the pattern-matching algorithms. In addition, a user can propose their own controllers to be searched by functional specifications. Furthermore, SEFS promotes the abstraction layer of circuit structure analysis from netlists to behavior layer. This enables a static analysis tool to ignore structural variants and still be confident in labeling machines with a design pattern provided their behavior can enforce the specified functionality. SEFS additionally benefits the user with a shorter workflow and more consistent check results. For example, SEFS does not require the double check pass in the current workflow as illustrated in FIG. 1 for advanced netlist check (e.g., blocks 112, 114, and 118 of FIG. 1 above).

As described above, process 200 of FIG. 2 performs a proposition binding search using the stored mealy machines. FIG. 4 illustrates an exemplary pseudo code 400 for signal binding search, according to one embodiment. In one embodiment, process 200 performs pseudo code 400 for the proposition binding search. In one embodiment, the input to the signal binding search is the set of design code Mealy machine (D), the functional specification (S), and the Master Plan Mealy machine, $MP_s$. At line 1, the pseudo code 400 creates a union of output ports union $O_D$ from the design codes D. Pseudo code 400 creates a set of input designs ($I_D$) that gives the real input ports of a design, where the intermediate output ports are excluded at line 2.

At line 3, pseudo code 400 performs an outer loop (lines 3-8) by enumerating of all bindings between design outputs and specification outputs. For the current output binding, $b_o$, pseudo code 400 calculates the dependent outputs and stores this into DepOut at line 4. At line 5, pseudo code 400 determines the set of Mealy machines, DepMac, that drive the output. In one embodiment, the set of Mealy machines that drive the output are determined from the Mealy machines that are machines which drive some output ports from DepOut. At line 6, pseudo code 400 calculates the input mapping, Depin, from the union of Mealy machines from DepMac that is the intersection of $I_j$ and $I_D$. In one embodiment, the intersection of the $I_j$ and $I_D$ gives the real input ports of machine $M_j$, as $I_j$ is the input port of $M_j$. Pseudo code 400 performs an inner loop (lines 7-8) to enumerate over the binding in Depin to determine which bindings represent a refinement machine. At line 8, pseudo code 400 performs the routine is_a_refinement on the current binding to determine if the current binding, $b_I$, is a refinement of the Master Plan Mealy machine, $MP_s$. If the current binding, $b_I$, is a refinement, there is a Mealy machine that is a refinement of $MP_s$ and pseudo code 400 recognizes $b_I$ under $b_O$ as an instance of a solution and adds <$b_I$, $b_O$> to the output of the check result. Determining whether the current binding, $b_I$, is a refinement is further described in FIG. 5 below. The inner and outer loops end at line 8.

FIG. 5 illustrates an exemplary pseudo code 500 for a Mealy machine refinement check, according to one embodiment. In one embodiment, pseudo code 500 performs the routine is_a_refinement routine of pseudo code 400. The input for pseudo code 500 includes the output binding $b_O$, the input binding $b_I$, the design Mealy machine $M_1$, and the specification Mealy machine $M_2$. The pseudo code 500 begins at lines 1-2, where pseudo code 500 determines if a condition gives the constraint on refinement reasoning. Process 500 works on $M_1$ and $M_2$ if $M_1$ has fewer input ports and more output ports. If this is not the case, pseudo code 500 does not carry out the refinement check, because a machine with more input ports and fewer output ports is more nondeterministic in behavior. If this condition exists, pseudo code 500 returns false as $M_1$ is not a refinement of $M_2$.

If the condition does not exist, at line 3, pseudo code sets the variable M to a tuple that is a cross product of $M_1$ and $M_2$. In one embodiment, the tuple is <Q, $I_2$, $O_2$, $q_{ini}$, T>. At line 4, pseudo code 500 initializes Frontier to {$q_{ini}$}. In one embodiment, the Frontier is the set of states to be explored. The initial Frontier has one state, the $q_{ini}$. Pseudo code 500 stores the new reachable states that are not encountered before in New_Frontier (line 16), and replace Frontier with New_Frontier at line 17. Therefore, the second iteration of Frontier includes the states reachable directly from $q_{ini}$. By this approach, Frontier is the set of states newly reached and should be explored in the next iteration. The process continues until there are no more new reachable states, where New_Frontier is empty. Consequently, the next Frontier is empty as well (line 5).

Pseudo code 500 performs a loop (lines 5-17) to determine if $M_1$ is a refinement of $M_2$. In one embodiment, pseudo code 500 determines if $M_1$ is a refinement of $M_2$, by checking the reachable states of product machine of $M_1$ and $M_2$. For example and in one embodiment, $M_1$ refines $M_2$ if each reachable state q of the product machine from $M_1$ and $M_2$ has an output letter for each input letter. In one embodiment, pseudo code 500 enumerates over the Frontiers and breaks the loop when a Frontier is empty. Pseudo code 500 initializes a New_Frontier at line 6.

Pseudo code 500 performs a further loop (lines 7-16) to enumerate over the Frontiers and performs another loop (lines 8-16) to enumerate over all input values. At line 9, pseudo code 500 computes the ForwardExp, which is the forward expression for the input and output bindings. In one embodiment, the ForwardExp value for the input and output bindings are calculated based on the binding expression, BindExp, the active expression, ActiveExp, and the delta of the expression, DeltaExp. These values are further described below in FIG. 6. If the forward expression, ForwardExp, is un-satisfiable, pseudo code 500 returns false. In one embodiment, if the ForwardExp is false, then $M_1$ does not refine $M_2$.

If the forward expression, ForwardExp, is satisfiable, pseudo code 500 computes the new reachable state at line 12. Pseudo code 500 performs a further loop (lines 13-16) for each state in the next Frontier to determine if the state has been visited. If the state q has not been visited, it will be added to the Visited list (line 15), and the New_Frontier (line 16). The three inner loops end at line 16. Pseudo code 500, at line 17, updates Frontier with New_Frontier. In this way the process determines whether each identified binding is a refinement of the Master Plan.

Figure 6:
FIG. 6 illustrates an exemplary pseudo code for components used to calculate the value of ForwardExp, according to one embodiment.

FIG. 6 illustrates an exemplary pseudo code for components used to calculate the value of ForwardExp, according to one embodiment. At line 1, pseudo code 600 illustrates the calculation of the function BindExp(b). In one embodiment, the binding for b between proposition sets U and V encodes the equivalency relationship over propositions as illustrated in line 1 of FIG. 6. At line 2, pseudo code 600 illustrates the calculation of the function ActiveExp($q_1$) that encodes the configuration of Q when q is active as illustrated in line 1 of FIG. 6. In one embodiment, ActiveExp($q_1$) encodes the configuration of Q where $q_1$ is an element of Q. At line 3, pseudo code 600 illustrates the calculation of the function TransExp( ) In one embodiment, for state $q \subseteq Q$ and an input letter $\sigma \epsilon \Sigma_I$, TransExp(q, $\sigma_I$) encodes the transition of q on $\sigma_I$, and DeltaExp(q) encodes all the transitions of q.

Figure 7:
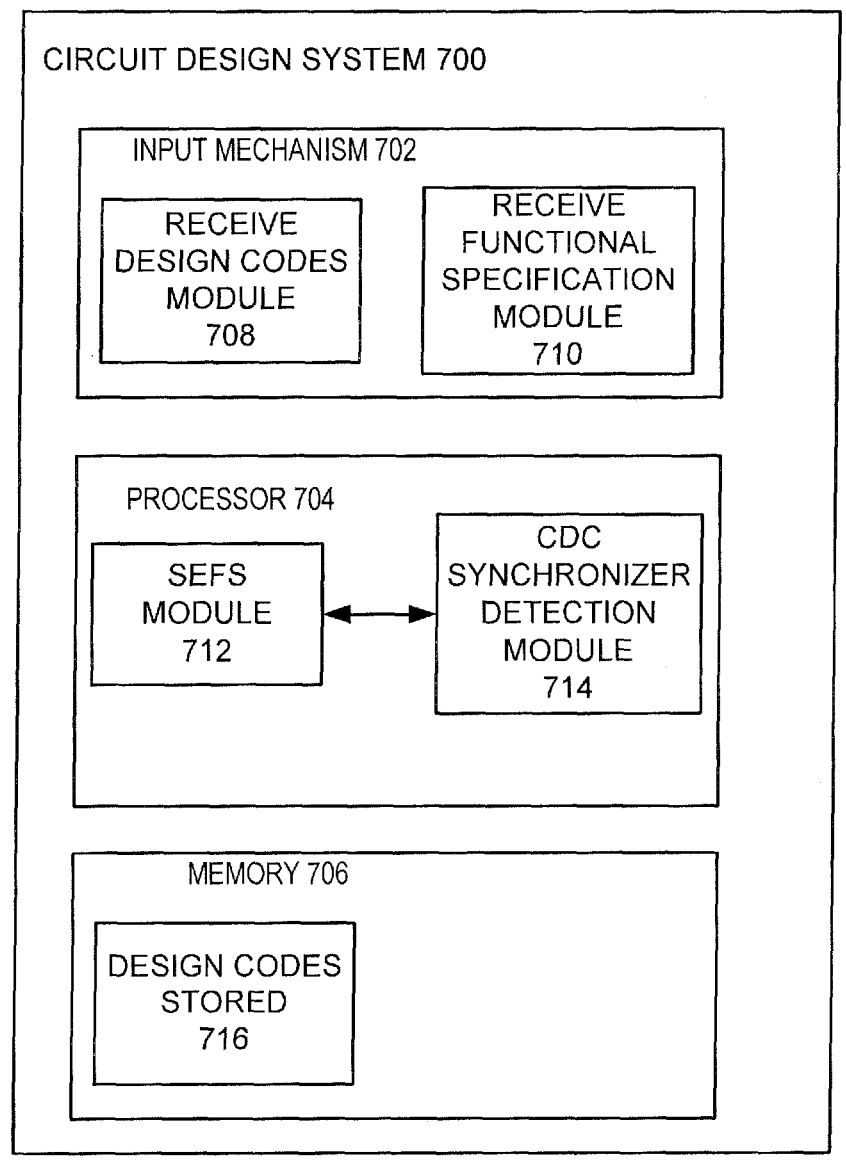
FIG. 7 illustrates a block diagram of a device that performs sequential structure extraction by functional specification and a clock-domain-crossing synchronizer detection with a sequential structure extraction by functional specification according to one embodiment.

FIG. 7 illustrates a block diagram of a circuit design system 700 that performs sequential structure extraction by functional specification and a clock-domain-crossing synchronizer detection using a sequential structure extraction by functional specification according to one embodiment. In one embodiment, circuit design system 700 includes an input mechanism 702, processor 704, and memory 706. In one embodiment, the input mechanism receives the inputted design codes and comprises receive design codes modules 708 and receive functional specification module 710. In one embodiment, receive design codes module 802 receives the design codes as described in FIG. 2, block 202 above. In one embodiment, the receive functional specification module 710 as described in FIG. 2, block 210 above.

In one embodiment, the processor 704 includes the SEFS module 712 and CDC synchronizer module 714. In one embodiment, the processor 704 is one or more microprocessors, such as the one or more microprocessors 1003 as described in FIG. 10 below. In one embodiment, the SEFS module 712 performs a SEFS that aims at a search engine, which automatically picks out signals from design codes such that the driving machines of selected signals can enforce the satisfiability of a realizable specification as described in blocks 204, 206, 208, 212, 214, 216, and 218 of FIG. 2 above. The CDC synchronizer detection module 714 performs a CDC synchronizer detection using the SEFS module 702 as described in FIG. 3 above.

In one embodiment, the memory 706 is memory as described in FIG. 10 below. In one embodiment, the memory 706 further includes one or more design codes that satisfy the functional specification of the circuit design.

Figure 8:
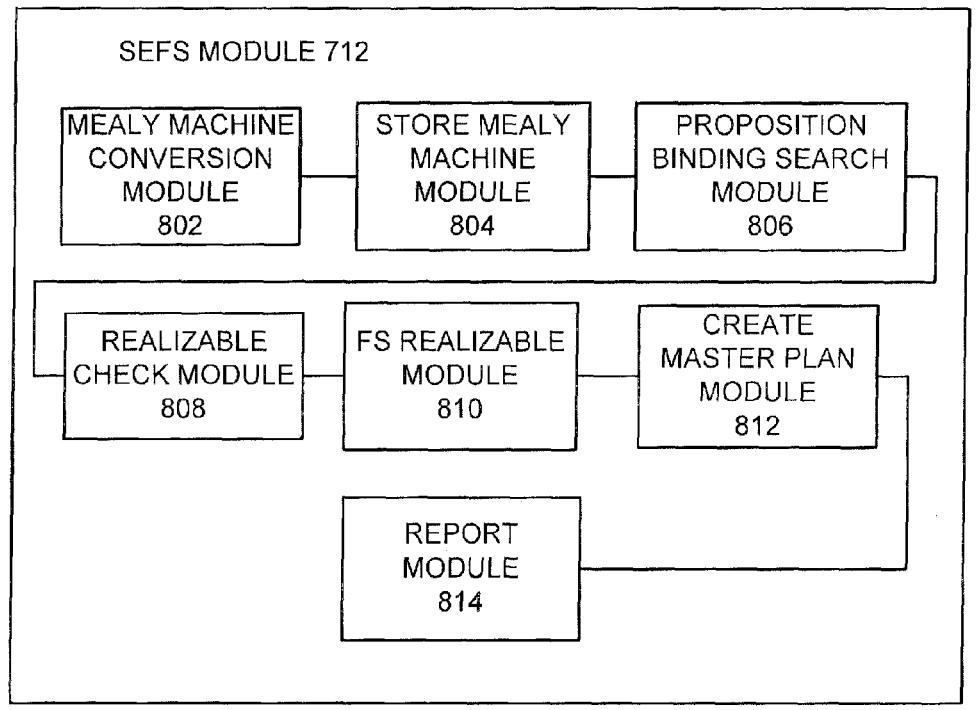
FIG. 8 illustrates a block diagram of a device that performs sequential structure extraction by functional specification according to one embodiment.
Figure 9:
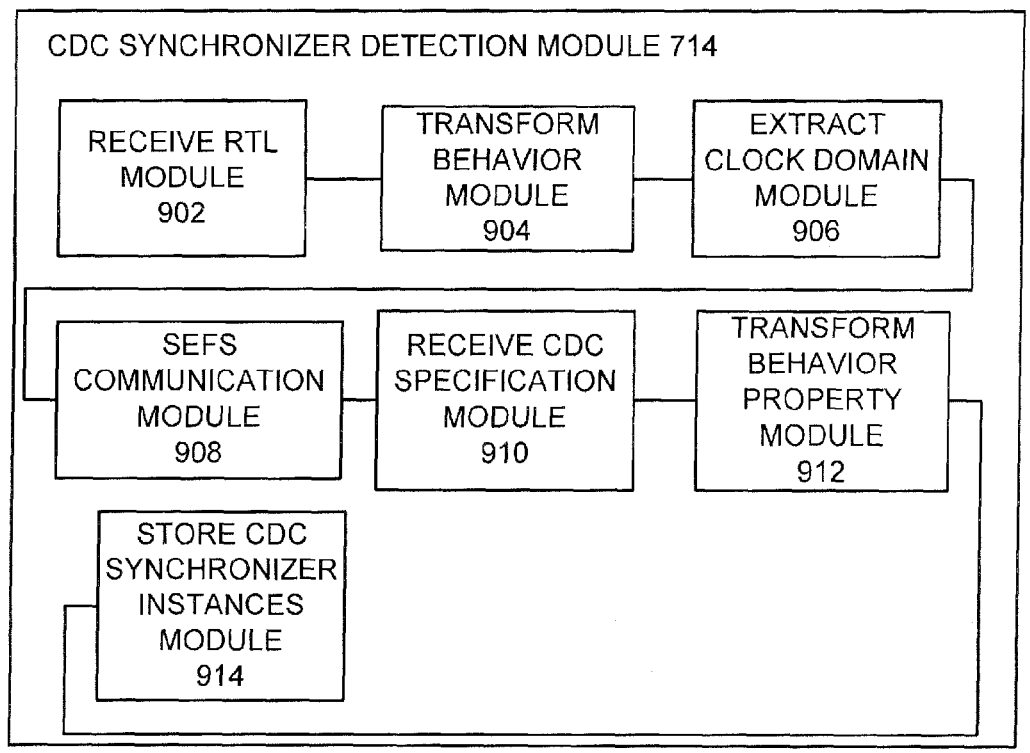
FIG. 9 illustrates a block diagram of a module to perform a clock-domain-crossing synchronizer detection with a sequential structure extraction by functional specification, according to one embodiment.

FIG. 8 illustrates a block diagram of a SEFS module 712 according to one embodiment. In one embodiment, SEFS module 712 includes Mealy machine conversion module 802, store Mealy machine 804, proposition binding search module 806, realizable check module 808, functional specification realizable module 810, create master plan module 812, and report module 814. The Mealy machine conversion module 802 coverts the design code to Mealy machines as described in FIG. 2, block 204 above. The store Mealy machine 804 stores the Mealy machines as described in FIG. 2, block 206 above. The proposition binding search module 806 performs a proposition binding search as described in FIG. 2, block 208 above. The realizable check module 808 calculates the realizability of the functional specification as described in FIG. 2, block 212 above. The functional specification realizable module 810 determines if the functional specification is realizable as described in FIG. 2, block 214 above. The create master plan module 812 generates the Mealy machine for the functional specification as described in FIG. 2, block 216 above. The report module 814 generates the report as described in FIG. 2, block 218 above FIG. 9 illustrates a block diagram of a CDC synchronizer detection module 714 to perform clock-domain-crossing synchronizer detection with a sequential structure extraction by functional specification, according to one embodiment. In one embodiment, the CDC synchronizer detection module 704 includes receive RTL module 902, transform behavior module 904, extract clock domain module 906, SEFS communication module 908, received CDC specification module 910, transform behavior property module 912, and store CDC synchronizer instances module 914. The receive RTL module 902 receives the RTL as described in FIG. 3, block 302 above. The transform behavior module 904 transforms the behavior of the RTL as described in FIG. 3, block 304 above. The extract clock domain module 906 extracts the clock domain information as described in FIG. 3, block 306 above. The SEFS communication module 908 communicates with the SEFS module 702 to perform a SEFS search as described in FIG. 3, block 308 above. The received CDC specification module 910 receives the CDC specification as described in FIG. 3, block 310 above. The transform behavior property module 912 transforms the CDC specification for properties as described in FIG. 3, block 312 above. The store CDC synchronizer instances module 914 stores CDC synchronizer instances as described in FIG. 3, block 314 above.

This description and drawings are illustrative of embodiments and are not to be construed as limiting the invention.

Numerous specific details are described to provide a thorough understanding of the disclosed embodiments. However, in certain instances, well known or conventional details are not described in order to avoid obscuring the description of the disclosed embodiments. References to "an" or "one" embodiment in the present disclosure are not necessarily to the same embodiment; such references mean at least one embodiment.

Many of the methods of the disclosed embodiments may be performed with a digital processing system, such as a conventional, general-purpose computer system. Special purpose computers, which are designed or programmed to perform only one function, may also be used.

Figure 10:
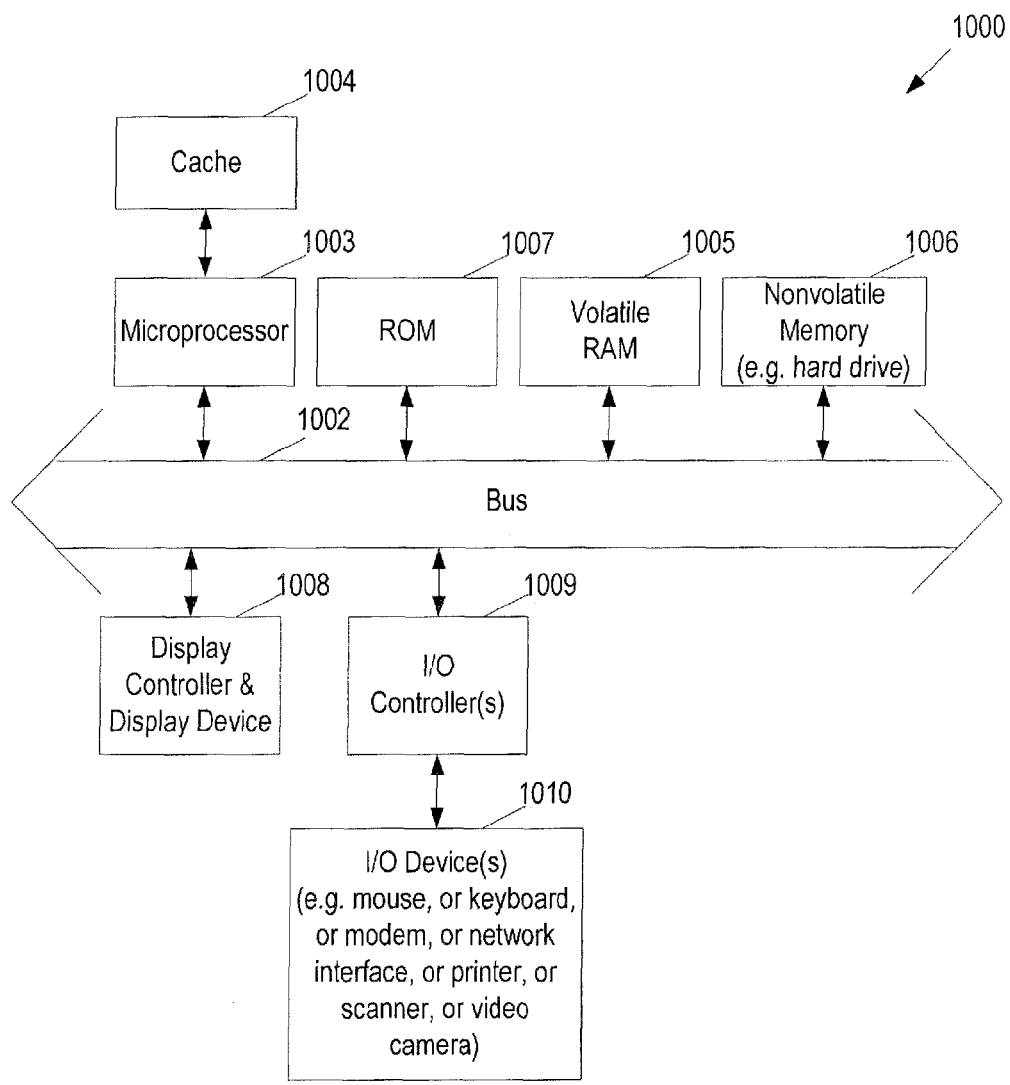
FIG. 10 illustrates a block diagram of an exemplary data processing system configured for use with the disclosed embodiments.

FIG. 10 shows one example of a typical computer system or data processing system that may be used with the disclosed embodiments. For example, in one embodiment the processes described with respect to FIGS. 2-6 is operational through the example computing system. However, it is noted that while FIG. 10 illustrates various components of a computer system, it is not intended to represent any particular architecture or manner of interconnecting the components but rather provides an example representation of how the components and architecture may be configured. It will also be appreciated that network computers and other data processing systems that have fewer components or perhaps more components may also be used with the disclosed embodiments. The computer system of FIG. 10 may be any computing system capable of performing the described operations.

As shown in FIG. 10, the computer system 1000, which is a form of a data processing system, includes a bus 1002, which is coupled to one or more microprocessors 1003. In one embodiment, computer system 1000 includes one or more of a read only memory (ROM) 1007, volatile memory (RAM) 1005, and a non-volatile memory (EEPROM, Flash) 1006. The microprocessor 1003 is coupled to cache memory 1004 as shown in the example of FIG. 10. Cache memory 1004 may be volatile or non-volatile memory.

The bus 1002 interconnects these various components together and in one embodiment interconnects these components 1003, 1007, 1005, and 1006 to a display controller and display device 1008. The computer system 1000 may further include peripheral devices such as input/output (I/O) devices, which may be mice, keyboards, modems, network interfaces, printers, scanners, video cameras and other devices which are well known in the art. Typically, the input/output devices 1010 are coupled to the system through input/output controllers 1009.

The volatile RAM 1005 is typically implemented as dynamic RAM (DRAM) which requires power continually in order to refresh or maintain data in the memory. The non-volatile memory 1006 is typically a magnetic hard drive, magnetic optical drive, an optical drive, a DVD RAM, a Flash memory, or other type of memory system which maintains data even after power is removed from the system. Typically, the non-volatile memory will also be a random access memory although this is not required.

While FIG. 10 shows that the non-volatile memory is a local device coupled directly to the rest of the components in the data processing system, it will be appreciated that the disclosed embodiments may utilize a non-volatile memory which is remote from the system, such as a network storage device which is coupled to the data processing system through a network interface such as a modem or Ethernet interface.

The bus 1002 may include one or more buses connected to each other through various bridges, controllers and/or adapters as is well known in the art. In one embodiment the I/O controller 1009 includes a USB (Universal Serial Bus) adapter for controlling USB peripherals, and/or an IEEE-1394 bus adapter for controlling IEEE-1394 peripherals.

It will be apparent from this description that aspects of the disclosed embodiments may be embodied, at least in part, in software (or computer-readable instructions). That is, the techniques, for example the processes of FIGS. 1 and 4 may be carried out in a computer system or other data processing system in response to its processor, such as a microprocessor, executing sequences of instructions contained in a memory, such as ROM 1007, volatile RAM 1005, non-volatile memory 1006, cache 1004 or a remote storage device. In various embodiments, hardwired circuitry may be used in combination with software instructions to implement the disclosed embodiments. Thus, the techniques are not limited to any specific combination of hardware circuitry and software nor to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor, such as the microprocessor 1003.

A machine readable storage medium can be used to store software and data which when executed by a data processing system causes the system to perform various methods of the disclosed embodiments. This executable software and data may be stored in various places including for example ROM 1007, volatile RAM 1005, non-volatile memory 1006 and/or cache 1004 as shown in FIG. 10. Portions of this software and/or data may be stored in any one of these storage devices.

Thus, a machine readable storage medium includes any mechanism that stores any information in a form accessible by a machine (e.g., a computer, network device, personal digital assistant, manufacturing tool, any device with a set of one or more processors, etc.). For example, a machine readable medium includes recordable/non-recordable media (e.g., read only memory (ROM); random access memory (RAM); magnetic disk storage media; optical storage media; flash memory devices; etc.).

The detailed description of embodiments makes reference to the accompanying drawings in which like references indicate similar elements, showing by way of illustration specific embodiments of practicing the invention. Description of these embodiments is in sufficient detail to enable those skilled in the art to practice the invention. One skilled in the art understands that other embodiments may be utilized and that logical, mechanical, electrical, functional and other changes may be made without departing from the scope of the present invention. The detailed description is, therefore, not to be taken in a limiting sense, and the scope of the present invention is defined by the appended claims.

References within the specification to "one embodiment" or "an embodiment" are intended to indicate that a particular feature, structure, or characteristic described in connection with the embodiment is included in at least one embodiment of the present invention. The appearance of the phrase "in one embodiment" in various places within the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Some portions of the detailed description were presented as procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is conceived to be a self-consistent sequence of steps or instructions leading to a desired result. The steps are those requiring physical manipulations of physical quantities. Usually, though not necessarily, these quantities take the form of electrical or magnetic signals of a computer readable storage medium and are capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "receiving" or "storing" or "searching" or "determining" or "converting" or the like, refer to the action and processes of a computer system, or similar electronic computing device that manipulates and transforms data represented as physical (electronic) quantities within the computer system's registers and memories and other computer readable media into other data similarly represented as physical quantities within the computer system memories or registers or other such information storage, transmission or display devices.

In the foregoing specification, the disclosed embodiments have been described with reference to specific exemplary embodiments thereof. It will, however, be evident that various modifications and changes may be made thereto without departing from the broader spirit and scope as set forth in the appended claims. The specification and drawings are, accordingly, to be regarded in an illustrative rather than a restrictive sense.

What is claimed is:

1. A method of structure analysis for a circuit design, the method comprising:
   receiving a functional specification of the circuit design, wherein the functional specification is defined based on a behavior layer abstraction;
   receiving a plurality of design codes for the circuit design, wherein each of the plurality of design codes is defined based on the behavior layer abstraction;
   searching, with a circuit design system, the plurality of design codes for one or more of the plurality of design codes that satisfy the functional specification of the circuit design, wherein the searching is performed in the behavior layer abstraction.

2. The method of claim 1, wherein the behavior layer abstraction describes a behavior of the circuit design.

3. The method of claim 1, wherein each of the one or more design codes that satisfy the functional specification is a design code that refines the functional specification.

4. The method of claim 1, wherein the functional specification is a Mealy machine and each of the plurality of design codes is a Mealy machine functional specification.

5. The method of claim 4, wherein each of the one or more design codes that satisfy the functional specification is a design code with a Mealy machine that refines the Mealy machine functional specification.

6. The method of claim 1, wherein the receiving the functional specification further comprises:
   determining if the functional specification is realizable; and
   if the functional specification is realizable, converting the functional specification to the behavior layer abstraction.

7. The method of claim 6, wherein the functional specification is realizable when there is a winning strategy to enforce satisfiability of the functional specification.

8. The method of claim 1, wherein the receiving the plurality of design codes comprises:
   receiving a set of hardware design codes in a hardware description language; and
   converting each of the set of hardware design codes to one of the plurality of design codes.

9. The method of claim 8, wherein each hardware design code of the set of hardware design codes is a register transfer level design code.

10. The method of claim 1, wherein the functional specification includes an interface for input and output, assumptive properties over input ports, and guaranteed properties over output ports.

11. The method of claim 1, wherein the functional specification defines a clock-domain-synchronizer.

12. The method of claim 11, wherein the functional specification describes interface signals and behavior properties of the clock-domain-synchronizer.

13. The method of claim 11, further comprising:
   extracting clock domain information from the plurality of design codes.

14. The method of claim 11, wherein the searching comprises:
   searching for one or more of the plurality of design codes that refines the functional specification of a clock-domain-crossing synchronizer.

15. A non-transitory computer-readable storage medium storing instructions thereon, the instructions, when executed by a processor, cause the processor to perform a method comprising:
   receiving a functional specification of a circuit design, wherein the functional specification is defined based on a behavior layer abstraction;
   receiving a plurality of design codes for the circuit design, wherein each of the plurality of design codes is defined based on a behavior layer abstraction; and
   searching the plurality of design codes for one or more of the plurality of design codes that satisfy the functional specification of the circuit design, wherein the searching is performed in the behavior layer abstraction.

16. The non-transitory computer-readable storage medium of claim 15, wherein the behavior layer abstraction describes a behavior of the circuit design.

17. The non-transitory computer-readable storage medium of claim 16, wherein each of the one or more design codes that satisfy the functional specification is a design code that refines the functional specification.

18. A circuit design system comprising:
   means for receiving a functional specification of a circuit design, wherein the functional specification is defined based on a behavior layer abstraction;

means for receiving a plurality of design codes for the circuit design, wherein each of the plurality of design codes is defined based on a behavior layer abstraction;

means for searching the plurality of design codes for one or more of the plurality of design codes that satisfy the functional specification of the circuit design, wherein the searching is performed in the behavior layer abstraction; and means for storing the one or more of the plurality of design codes that satisfy the functional specification of the circuit design.

19. The circuit design system of claim 18, wherein the means receiving a functional specification further comprises:

means for determining if the functional specification is realizable; and if the functional specification is realizable, means for converting the functional specification to be based on the behavior layer abstraction.

20. A computer system to perform structure analysis for a circuit design, the system comprising:

an input mechanism to receive a functional specification of the circuit design, wherein the functional specification is defined based on a behavior layer abstraction and to receive a plurality of design codes for the circuit design, wherein each of the plurality of design codes is defined based on a behavior layer abstraction;

a processor to search the plurality of design codes for one or more of the plurality of design codes that satisfy the functional specification of the circuit design, wherein the searching is performed in the behavior layer abstraction; and a memory to store the one or more of the plurality of design codes that satisfy the functional specification of the circuit design.

* * * * *